US012689164B2

(12) United States Patent
Mazbar et al.

(10) Patent No.: US 12,689,164 B2
(45) Date of Patent: Jul. 21, 2026

(54) UNIVERSAL HOUSING FOR PLUGGABLE NETWORK INTERFACE DEVICES

(71) Applicant: MELLANOX TECHNOLOGIES, LTD., Yokneam (IL)

(72) Inventors: Aziz Mazbar, Nof HaGalil (IL); Nimr Hazin, Bane (IL); Andrey Ger, Shlomi (IL); Jamal Mousa, Haifa (IL); Bar Noyman, Kfar HaHoresh (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 308 days.

(21) Appl. No.: 18/370,748

(22) Filed: Sep. 20, 2023

(65) Prior Publication Data

US 2025/0096509 A1    Mar. 20, 2025

(51) Int. Cl.
H01R 13/66 (2006.01)
H05K 1/02 (2006.01)

(52) U.S. Cl.
CPC ....... H01R 13/6658 (2013.01); H05K 1/0212 (2013.01); H01R 2201/04 (2013.01)

(58) Field of Classification Search
CPC .. H05K 1/0212; H05K 1/0203; H05K 1/0209; H01R 13/6658; H01R 2201/04

USPC .................................................. 439/76.1, 487
See application file for complete search history.

(56) References Cited

U.S. PATENT DOCUMENTS

| | | | | |
|---|---|---|---|---|
| 7,422,471 | B1 * | 9/2008 | Wu | H01R 13/6658 |
| | | | | 439/485 |
| 10,993,352 | B2 * | 4/2021 | Bucher | H01R 12/716 |
| 11,454,774 | B2 * | 9/2022 | Hsiao | H01R 13/66 |
| 2017/0194751 | A1 * | 7/2017 | Little | H01L 23/467 |
| 2018/0034211 | A1 * | 2/2018 | Little | H01R 13/6581 |
| 2021/0247577 | A1 * | 8/2021 | Hsiao | H05K 7/2039 |

* cited by examiner

*Primary Examiner* — Gary F Paumen
(74) *Attorney, Agent, or Firm* — Sheridan Ross PC

(57) ABSTRACT

A pluggable network interface device includes a printed circuit board ("PCB") and a housing configured to receive a heat transfer plate selected from a set of swappable heat transfer plates. An upper surface of the housing includes a set of modular plate receiving features. When in an assembled state, the upper surface of the housing is attached via the set of modular plate receiving features to one heat transfer plate of a set of heat transfer plates. The overall height of the pluggable network interface module in the assembled state is greater than a first assembly height dimension measured from a base surface of the housing to the upper surface of the housing. The set of modular plate receiving features are configured to engage with any heat transfer plate in the set of swappable heat transfer plates that are associated with different module types.

20 Claims, 9 Drawing Sheets

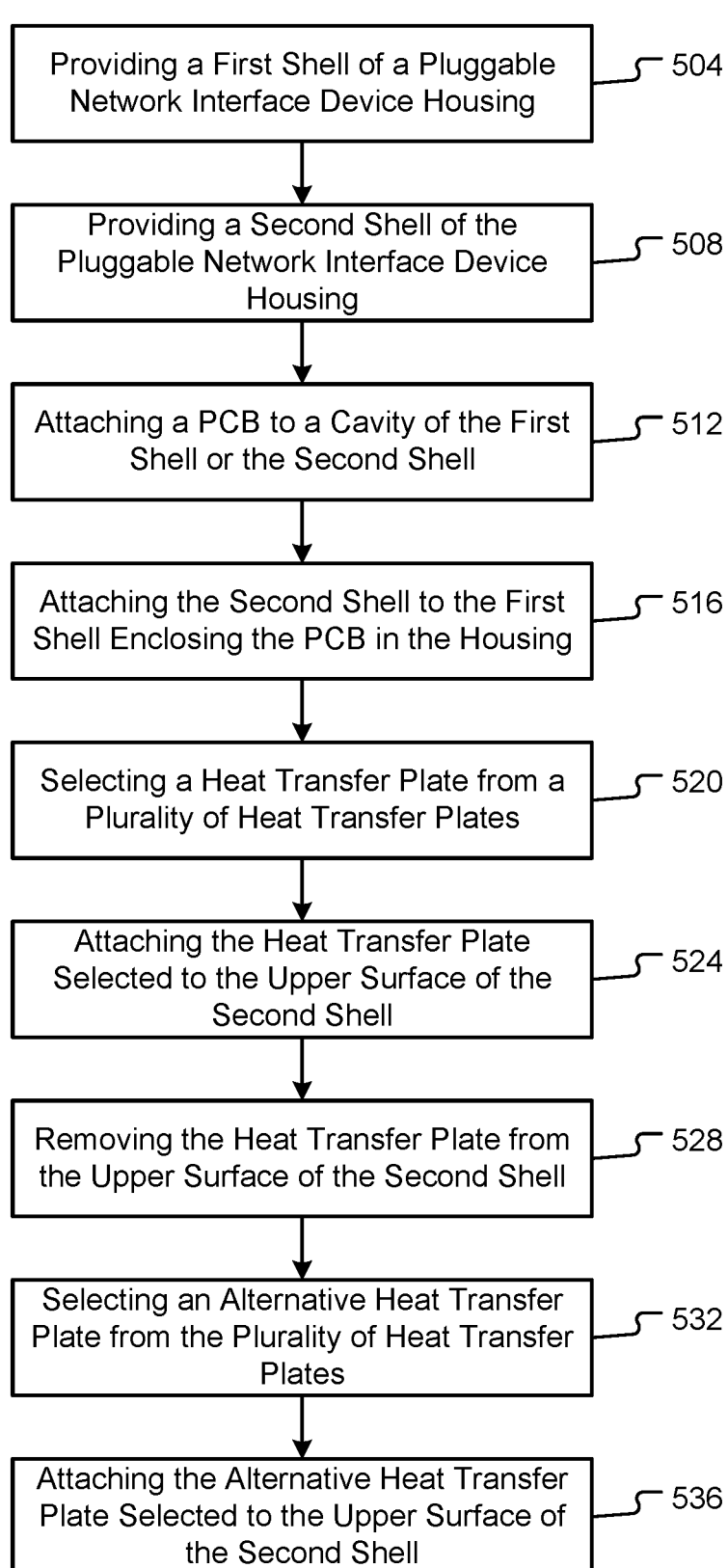

Providing a First Shell of a Pluggable Network Interface Device Housing — 504

Providing a Second Shell of the Pluggable Network Interface Device Housing — 508

Attaching a PCB to a Cavity of the First Shell or the Second Shell — 512

Attaching the Second Shell to the First Shell Enclosing the PCB in the Housing — 516

Selecting a Heat Transfer Plate from a Plurality of Heat Transfer Plates — 520

Attaching the Heat Transfer Plate Selected to the Upper Surface of the Second Shell — 524

Removing the Heat Transfer Plate from the Upper Surface of the Second Shell — 528

Selecting an Alternative Heat Transfer Plate from the Plurality of Heat Transfer Plates — 532

Attaching the Alternative Heat Transfer Plate Selected to the Upper Surface of the Second Shell — 536

FIG. 5

UNIVERSAL HOUSING FOR PLUGGABLE NETWORK INTERFACE DEVICES

BACKGROUND

The present disclosure is generally directed to networking cable assemblies and relates more particularly to pluggable network interface devices.

Datacenters are the storage and data processing hubs of the Internet. Cable assemblies are used to interconnect network devices and/or network switches within a datacenter to enable high-speed communication between the network switches.

BRIEF SUMMARY

Aspects of the present disclosure include a pluggable network interface module including a printed circuit board ("PCB") comprising at least one circuit; and a housing comprising: a first shell extending a length from a first end of the pluggable network interface module to a second end of the pluggable network interface module, the first shell comprising a first cavity running along a portion of the length and a base surface defining an exterior of the first shell; and a second shell extending the length and comprising a second cavity running along a portion of the length and an upper surface defining an exterior of the second shell, wherein the first shell is joined to the second shell, wherein the first cavity and the second cavity together form a receiving cavity for the housing, and wherein the upper surface is offset from the base surface by a first assembly height dimension; wherein a portion of the PCB is disposed inside the receiving cavity between the base surface and the upper surface, wherein the upper surface comprises a set of modular plate receiving features, and wherein, in an assembled state, the upper surface of the pluggable network interface module is attached via the set of modular plate receiving features to one heat transfer plate of a set of heat transfer plates, and wherein an overall height of the pluggable network interface module in the assembled state is greater than the first assembly height dimension.

In one embodiment, a pluggable network interface device kit is provided that includes a housing comprising: a first shell extending a length from a first end of a pluggable network interface device to a second end of the pluggable network interface device, the first shell comprising a first cavity running along a portion of the length and a base surface defining an exterior of the first shell; and a second shell extending the length and comprising a second cavity running along a portion of the length and an upper surface defining an exterior of the second shell, wherein the upper surface comprises a set of modular plate receiving features, wherein the first shell is joined to the second shell, wherein the first cavity and the second cavity together form a receiving cavity for the housing, and wherein the upper surface is offset from the base surface by a first assembly height dimension; a PCB comprising at least one circuit, wherein a portion of the PCB is disposed inside the receiving cavity between the base surface and the upper surface; and a first heat transfer plate attached to the upper surface of the second shell via the set of modular plate receiving features, wherein the first heat transfer plate comprises a first thickness extending a first distance from the upper surface of the second shell to an uppermost surface of the first heat transfer plate, wherein the first heat transfer plate comprises an outermost plate width corresponding to an overall outermost width of the housing, and wherein an outermost height measured from the base surface of the first shell to the uppermost surface of the first heat transfer plate is greater than the first assembly height dimension.

In an illustrative embodiment, a method of customizing a network interface module includes providing a first shell of a housing for a pluggable network interface device, the first shell extending a length from a first end of the pluggable network interface device to a second end of the pluggable network interface device, the first shell comprising a first cavity running along a portion of the length, and the first shell comprising a base surface defining an exterior of the first shell; providing a second shell extending the length and comprising a second cavity running along a portion of the length and an upper surface defining an exterior of the second shell, wherein the upper surface comprises a set of modular plate receiving features; attaching a PCB to the first cavity; attaching the second shell to the first shell enclosing a portion of the PCB in a receiving cavity formed by the first cavity and the second cavity, such that the upper surface is offset from the base surface by a first assembly height dimension; selecting a heat transfer plate from a plurality of heat transfer plates associated with a plurality of module types; and attaching the heat transfer plate selected to the upper surface via the set of modular plate receiving features such that an first overall height of the pluggable network interface device comprising the heat transfer plate attached thereto is greater than the first assembly height dimension.

Numerous additional features and advantages are described herein and will be apparent to those skilled in the art upon consideration of the following Detailed Description and in view of the figures.

BRIEF DESCRIPTION OF THE SEVERAL VIEWS OF THE DRAWINGS

The accompanying drawings are incorporated into and form a part of the specification to illustrate several examples of the present disclosure. These drawings, together with the description, explain the principles of the disclosure. The drawings simply illustrate preferred and alternative examples of how the disclosure can be made and used and are not to be construed as limiting the disclosure to only the illustrated and described examples. Further features and advantages will become apparent from the following, more detailed, description of the various aspects, embodiments, and configurations of the disclosure, as illustrated by the drawings referenced below.

FIG. 5 is a flow diagram of a method for customizing a network interface module in accordance with embodiments of the present disclosure.

DETAILED DESCRIPTION

Figure 1A:
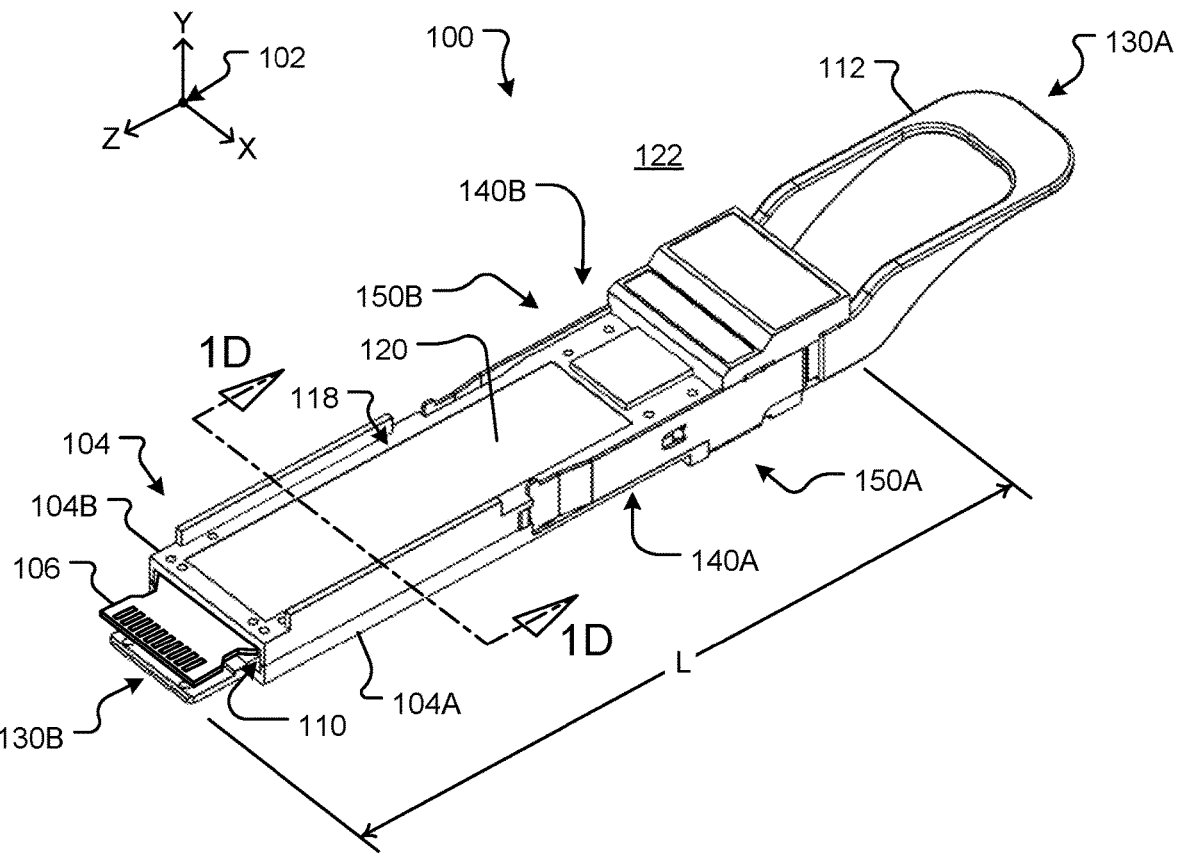
FIG. 1A shows a perspective view of a pluggable network interface device in accordance with embodiments of the present disclosure.
Figure 1B:
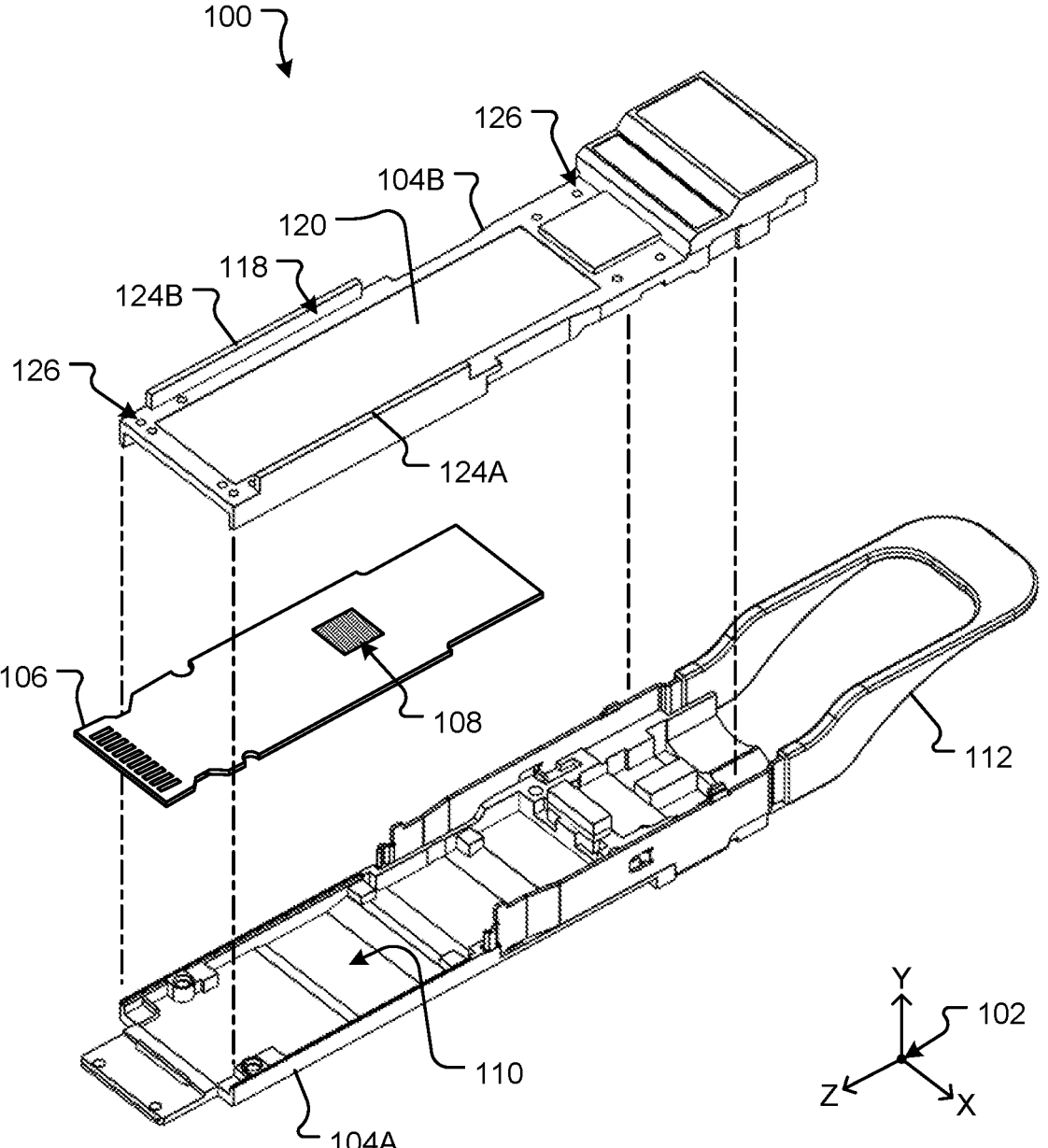
FIG. 1B shows an exploded top perspective view of the pluggable network interface device of FIG. 1A.
Figure 1C:
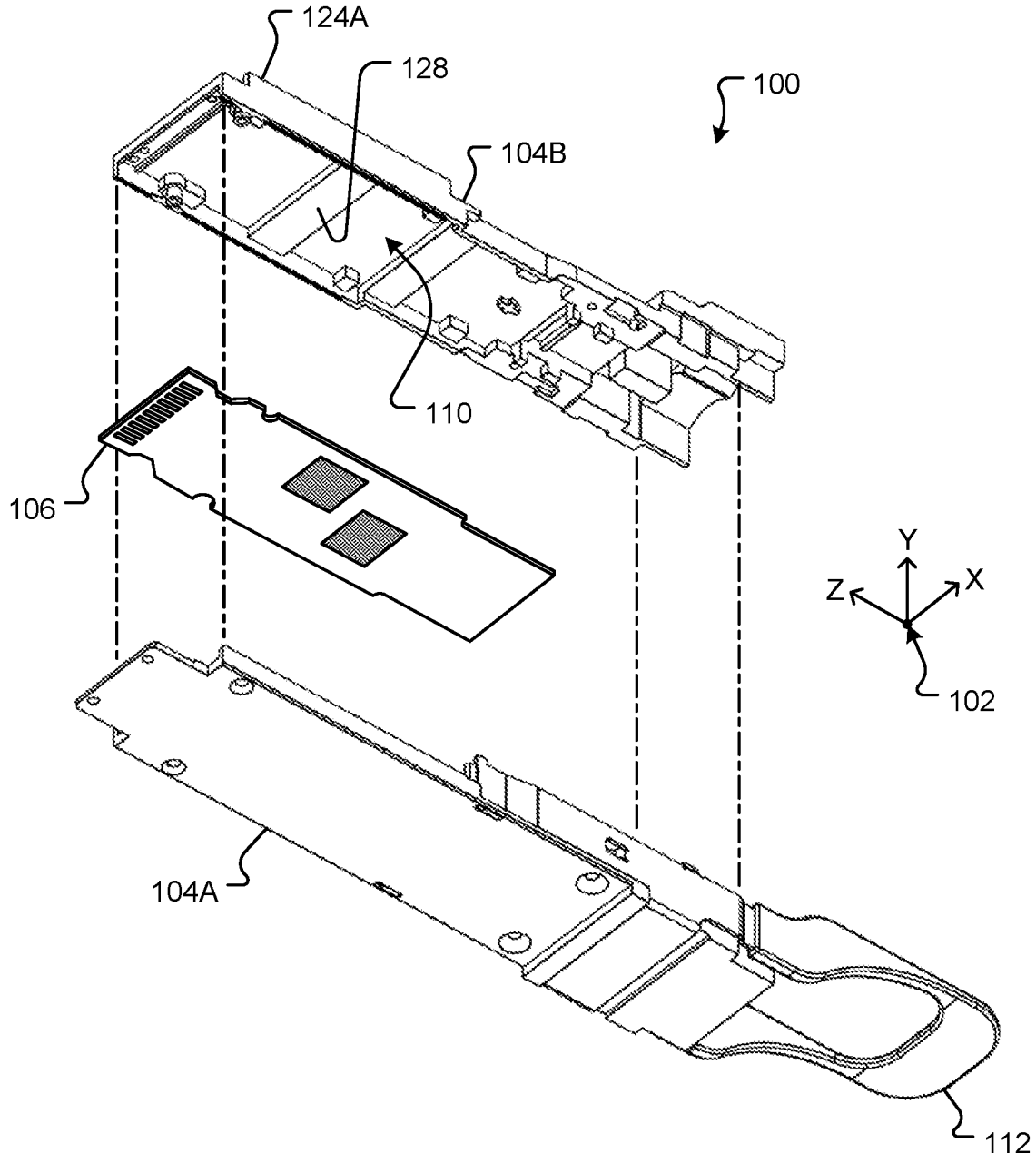
FIG. 1C shows an exploded bottom perspective view of the pluggable network interface device of FIG. 1A.

Before any embodiments of the disclosure are explained in detail, it is to be understood that the disclosure is not limited in its application to the details of construction and the arrangement of components set forth in the following description or illustrated in the drawings. The disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, the present disclosure may use examples to illustrate one or more aspects thereof. Unless explicitly stated otherwise, the use or listing of one or more examples (which may be denoted by "for example," "by way of example," "e.g.," "such as," or similar language) is not intended to and does not limit the scope of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that may be schematic illustrations of idealized configurations.

Pluggable network interface devices, or pluggable network interface modules, generally include a PCB, or circuit substrate, that is at least partially embedded in a housing. Each pluggable network interface device includes at least one heat-generating circuit package such as a clock and data recovery circuit ("CDR"), microcontroller, driver, chips, and/or other circuitry attached to the PCB that generates heat during use, or while in operation. As can be appreciated, the efficient dissipation of heat is critical to ensuring proper operation.

Conventional pluggable network interface devices, for example, octal small form factor pluggable ("OSFP") transceivers, etc., are built as integrated heatsink ("IHS") or riding heatsink ("RHS") types, and are typically designated as such from day one (e.g., work order level, etc.). These designated IHS or RHS OSFP devices are built and tested as such, and the only way to move from an IHS to an RHS OSFP is through total replacement or a lengthy and costly rework process.

The present disclosure allows the pluggable network interface device (e.g., OSFP transceiver, etc.) to be built and tested as a subassembly, which can then be placed in kanban (e.g., on-demand consumption-based inventory and/or supply). After a designation has been decided upon (e.g., according to orders), the subassembly may be transformed into an IHS or an RHS type of module via a short mechanical assembly process (e.g., four screws, etc.), and a short test to verify thermal performance (e.g., approximately 5 minutes, plus or minus a couple of minutes). In some embodiments, the present disclosure allows both RHS and/or IHS mechanical additions to be provided to an end user, or customer, as a kit, which can be assembled according to their needs.

In one embodiment, the present disclosure describes devices, systems, and methods that allow a customized pluggable network interface device to be developed in two stages. The first stage describes the creation of a universal subassembly that can be prepared for assembly and tests, and the second stage is the assembly of a customized desired module type (e.g., chosen from a plurality of module types including, but in no way limited to, an IHS module type, an RHS module type, etc.) via attachment of a select heat transfer plate from a set, or plurality, of heat transfer plates. The customization can be made or changed by the end user, the manufacturer, or any integrator of the pluggable network interface device, as needed or desired, by attaching, removing, and/or replacing a particular heat transfer plate with a different heat transfer plate. As used herein the term "heat transfer plate" may refer to a heatsink associated with one or more modes of heat transfer and/or with one or more module types of pluggable network interface device (e.g., IHS, RHS, etc.). The IHS type of module may refer to a module comprising a heat transfer plate that includes a heatsink, or spreader, with cooling fins, channels, and/or the like for cooling (e.g., convection, conduction, etc., and/or combinations thereof). The RHS type of module may refer to a module comprising a heat transfer plate that includes at least one heat transfer surface that is dependent on the host cage for cooling (e.g., via conduction, etc.). The finished and/or assembled IHS and/or RHS OSFP devices described herein may conform to, or within, the specifications described in the OSFP Multi-Source Agreement (MSA) group specification for "OSFP OCTAL SMALL FORM FACTOR PLUGGABLE MODULE," Rev. 5.0, Oct. 2, 2022 ("SPEC"), or equivalent.

The pluggable network interface device subassembly (e.g., prior to attaching a selected heat transfer plate) may be completely sealed between an internal space of the pluggable network interface device and the exterior of the pluggable network interface device. The seal may be watertight, airtight, and/or hermetically sealed such that dust, detritus, and/or particulate contamination may not enter inside the housing (e.g., the receiving cavity) of the pluggable network interface device subassembly from the exterior of the pluggable network interface device subassembly.

Once the pluggable network interface device subassembly is completed, and before the selected heat transfer plate is attached, the subassembly may undergo testing (e.g., standard OSFP testing, etc.) to ensure that the device operates within acceptable thresholds or limits. In this way, any of the tested subassemblies that operate within the acceptable thresholds/limits, can be safely married with a heat transfer plate of any type without requiring additional testing. For instance, once the subassembly is tested, the completion of the assembly of the pluggable network interface device includes selecting and attaching a heat transfer plate. This mechanical attachment of a component to the outside (e.g., housing, etc.) of the pluggable network interface device subassembly does not affect the performance subassembly tested and, as such, further performance testing can be minimized or completely avoided. In some embodiments, a single heat transfer test may be performed to ensure that the heat transfer plate and/or any thermal interface material was correctly installed and is serving to cool the pluggable network interface device during operation.

The pluggable network interface device subassembly may allow all of the necessary tests to be performed in the line. When choosing a designation (e.g., in the kanban or at a customer site), a select heat transfer plate (e.g., additional mechanical accessory) may be assembled to the subassembly, turning the pluggable network interface device into an OSFP IHS or RHS (e.g., conforming to the standards outlined in the SPEC, etc.).

Among other things, the devices, modules, assemblies, and methods described herein provide the benefit of allowing an end user to select, or modify, a pluggable network interface device at any time (e.g., during order, after order, after installation, etc.). In one embodiment, a universal pluggable network interface device subassembly may be shipped to the customer along with two different mechanical kits (e.g., IHS and RHS heat transfer plates and attachments). In another embodiment, a customer may select a particular type of assembled pluggable network interface device and selected module type (e.g., IHS and RHS module), which is shipped to the customer assembled as part of a kit along with an alternative heat transfer plate representing an alternative module type (e.g., RHS and IHS module) that is different from the heat transfer plate assembled to the pluggable network interface device selected. In any event, the one or more heat transfer plates included in the kit may include a pre-applied thermal interface material. The pre-applied thermal interface material may provide enhanced thermal transfer properties between the pluggable network interface device subassembly and a selected heat transfer plate. The thermal interface material may be in the form of a polymer, gel, paste, conductive pad, or other compliant material that is capable of accommodating variations in dimensions between the pluggable network interface device subassembly and the selected heat transfer plate. In some embodiments, the thermal interface material may include a protective cover that can be removed (e.g., before assembly of the associated heat transfer plate to the pluggable network interface device subassembly) to ensure the thermal interface material is sealed and/or otherwise protected (e.g., from drying out, being damaged, transferring to other objects, etc.). The protective cover may be attached to the heat transfer plates shipped as part of the pluggable network interface device kit.

As described herein, the pluggable network interface devices, or modules, may be configured with a suitable form factor, for example, a small form factor pluggable ("SFP"), SFP+, quad SFP ("QSFP"), QSFP+, QSFP-double density ("QSFP-DD"), OSFP, and/or the like.

It is with respect to the above issues and other problems that the embodiments presented herein were contemplated. Among other things, the present disclosure describes pluggable network interface devices that include a universal housing providing a common frame to which any heat transfer plate of a set of heat transfer plates can be quickly and easily attached, without unsealing the interior of the pluggable network interface device from the exterior of the pluggable network interface device. In this manner, the present disclosure provides a pluggable network interface device that can be customized, changed, or swapped for any module type of pluggable network interface device. Moreover, the pluggable network interface devices described herein provide the additional benefits of reducing the numbers of preassembled full pluggable network interface device module types in an inventory by allowing the pluggable network interface device to be customized as needed, or on demand. In any event, the customized and assembled pluggable network interface device solution can conform to current OSFP specifications and dimensional requirements (e.g., without deviating from the standard predefined sizes, tolerances, and dimensions set for OSFP devices in the SPEC).

Referring initially to FIGS. 1A-1D, views of a pluggable network interface device subassembly 100 are shown in accordance with embodiments of the present disclosure. Although referred to herein as a subassembly, it should be appreciated that the pluggable network interface device subassembly 100 represents a sealed and assembled device that may be used in forming a customized fully assembled pluggable network interface module. The pluggable network interface device subassembly 100 includes a housing 104, a circuit substrate 106 (e.g., a PCB, etc.) with at least one heat-generating circuit package 108, and an external plate receiving space 118 that is arranged on one or more exterior surfaces of the housing 104. In some embodiments, the pluggable network interface device subassembly 100 may be referred to herein as a pluggable network interface device, a pluggable network interface module, and/or a pluggable network interface module subassembly 100. The pluggable network interface device subassembly 100 may include a pull tab 112 arranged at the first end 130A (e.g., handling end) of the pluggable network interface device subassembly 100. The pull tab 112 may comprise a handle portion and/or aperture that can be grasped when handling, plugging, or unplugging the pluggable network interface device subassembly 100 with a receiving connection. The pluggable network interface device subassembly 100 may comprise one or more cables. The cables may comprise one or more copper cables, one or more fiber optic cables, and/or any other suitable cable for transmitting and/or receiving data. In a scenario where the cables include fiber optic cables, the pluggable network interface device 100 may include optical transceivers that convert electrical signals into optical signals and optical signals into electrical signals. In one non-limiting example, the pluggable network interface device 100 may comprise a direct attach cable ("DAC") cable assembly with an OSFP connector form factor. Details of the pluggable network interface device 100 are discussed in more detail below with reference to the figures.

Features of the pluggable network interface device subassembly 100 may be described in conjunction with a coordinate system 102. The coordinate system 102, as shown, for example, in FIGS. 1A-1D, includes three dimensions comprising an X-axis, a Y-axis, and a Z-axis. Additionally or alternatively, the coordinate system 102 may be used to define planes (e.g., the XY-plane, the XZ-plane, and the YZ-plane) of the pluggable network interface device subassembly 100 or the assembled pluggable network interface modules. These planes may be disposed orthogonal, or at 90 degrees, to one another. While the origin of the coordinate system 102 may be placed at any point on or near the components of the pluggable network interface device subassembly 100, for the purposes of description, the axes of the coordinate system 102 are always disposed along the same directions from figure to figure, whether the coordinate system 102 is shown or not. In some examples, reference may be made to dimensions, angles, directions, relative positions, and/or movements associated with one or more components of the pluggable network interface device sub-assembly 100 with respect to the coordinate system 102. For example, the width of the pluggable network interface device subassembly 100 and/or the assembled pluggable network interface module (e.g., running from the first width side 150A to the second width side 150B of the pluggable network interface device 100 and/or the assembled pluggable network interface module) may be defined as a dimension along the X-axis of the coordinate system 102, the height of the pluggable network interface device subassembly 100 and/or the assembled pluggable network interface module may be defined as a dimension along the Y-axis of the coordinate system 102, and the length, L, of the pluggable network interface device 100 and/or the assembled pluggable network interface module may be defined as a dimension along the Z-axis of the coordinate system 102.

Figure 1D:
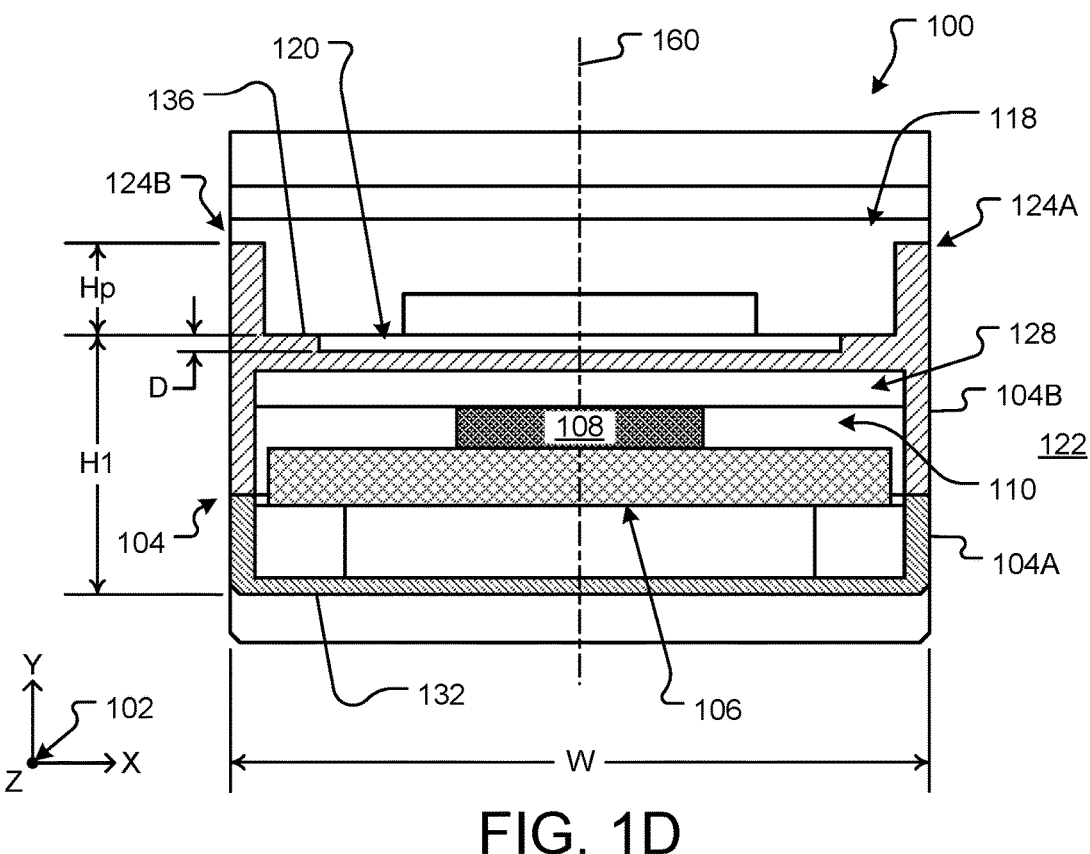
FIG. 1D shows a section view taken through line "1D-1D" of FIG. 1A in accordance with embodiments of the present disclosure.

In some embodiments, the pluggable network interface device subassembly 100, components and/or portions thereof, the heat transfer plates, etc. may be symmetrical about the centerline 160, for example, as shown in FIG. 1D (e.g., when the pluggable network interface device subassembly 100 is in an assembled state). The centerline 160 may correspond to a center plane that is disposed parallel to the YZ-plane of the coordinate system 102 and that bisects the pluggable network interface device subassembly 100 (e.g., along the length, L) through a width center of the pluggable network interface device subassembly 100.

Although not explicitly illustrated, it should be appreciated that the pluggable network interface device subassembly 100 may include processing circuitry and/or memory for carrying out computing tasks, for example, tasks associated with controlling the flow of data over a communication network. The processing circuitry may comprise software, hardware, or a combination thereof. For example, the processing circuitry may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include flash memory, Random Access Memory ("RAM"), Read Only Memory ("ROM"), variants thereof, combinations thereof, or the like. In some embodiments, the memory and processor may be integrated into a common device (e.g., a microprocessor may include integrated memory). Additionally or alternatively, the processing circuitry may comprise hardware, such as an application specific integrated circuit ("ASIC"). Other non-limiting examples of the processing circuitry include an Integrated Circuit ("IC") chip, a Central Processing Unit ("CPU"), a General Processing Unit ("GPU"), a microprocessor, a Field Programmable Gate Array ("FPGA"), a collection of logic gates or transistors, resistors, capacitors, inductors, diodes, or the like. Some or all of the processing circuitry may be provided on the circuit substrate 106 of the pluggable network interface device subassembly 100. The circuit substrate 106 may correspond to a PCB or a collection of PCBs. It should be appreciated that any appropriate type of electrical component or collection of electrical components may be suitable for inclusion in the processing circuitry.

The housing 104 may be configured as a split-shell housing having a first shell 104A and a second shell 104B. The first shell 104A may be referred to herein as a bottom shell, or bottom backshell and the second shell 104B may be referred to herein as a top shell, or top backshell. The first shell 104A may include a first cavity or space that runs along the length, L, of the pluggable network interface device subassembly 100. The second shell 104B may include a second cavity or space that runs along the length, L, of the pluggable network interface device 100. As provided above, the length, L, of the pluggable network interface device subassembly 100 may be measured from a first end 130A to an opposite second end 130B of the pluggable network interface device subassembly 100. Together, the first cavity and the second cavity form a receiving cavity 110 of the pluggable network interface device subassembly 100. The receiving cavity 110 may be sized to receive at least a portion of the circuit substrate 106 including at least one heat-generating circuit package 108. For instance, the circuit substrate 106 may be placed inside the first cavity and/or the second cavity and the second shell 104B may be attached (e.g., screwed, clipped, fastened, pinned, etc., and/or combinations thereof) to the first shell 104A forming the pluggable network interface device subassembly 100. When attached to one another, a height of the housing 104 and/or the pluggable network interface device subassembly 100 may be measured from a base surface 132 of the first shell 104A that is disposed adjacent the first height side 140A to the upper surface 136 of the second shell 104B that is disposed adjacent the second height side 140B. The outer surface of the housing 104 may provide an outer shell that defines the exterior 122 of the housing 104. In some embodiments, the outer shell separates the receiving cavity 110 from the exterior 122 of the housing 104 (e.g., separating an interior of the pluggable network interface device subassembly 100 from the environment that is exterior to the housing 104).

An external plate receiving space 118 is arranged adjacent the second height side 140B (e.g., the upper surface 136) of the second shell 104B. The external plate receiving space 118 includes a set of modular plate receiving features comprising at least one of a recessed portion 120, sidewalls 124A, 124B, threaded holes 126, and/or the upper surface 136 of the second shell 104B.

The recessed portion 120 may be configured as a pocket extending from the upper surface 136 in a Y-axis direction toward the circuit substrate 106 inside the receiving cavity 110 of the housing 104 (e.g., in the assembled state). As illustrated in FIG. 1D, the recessed portion 120 may extend into a portion of the second shell 104B a depth dimension, D, without breaking through the second shell 104B into the receiving cavity 110. The recessed portion 120 may be configured to receive a thermal interface material. The recessed portion 120 may be machined, cast, etched, or otherwise formed in the second shell 104B.

The sidewalls 124A, 124B may correspond to protrusions extending from the upper surface 136 a protrusion height point distance, Hp, from upper surface 136 in a direction away from the first shell 104A. The sidewalls 124A, 124B may correspond to a tab, tenon, or other protrusion that engages with a receiving feature in a heat transfer plate, such as a slot, mortise, or channel. Among other things, the sidewalls 124A, 124B may align a heat transfer plate with the external plate receiving space 118 and the housing 104 of the pluggable network interface device subassembly 100. Once a selected heat transfer plate is attached to the external plate receiving space 118, the heat transfer plate may be constrained from movement in the X-axis and Z-axis directions by the sidewalls 124A, 124B. The sidewalls 124A, 124B include a first sidewall 124A spaced apart from a second sidewall 124B. The first sidewall 124A may be arranged as a protrusion extending from the upper surface 136 of the second shell 104B on the first width side 150A of the pluggable network interface device subassembly 100. The second sidewall 124B may be arranged as a protrusion extending from the upper surface 136 of the second shell 104B on the second width side 150B of the pluggable network interface device subassembly 100. The sidewalls 124A, 124B may extend along a portion of the length, L, of the pluggable network interface device subassembly 100 (e.g., along the Z-axis direction).

The threaded holes 126 may correspond to one or more threaded holes that are capable of receiving corresponding threaded fasteners (e.g., screw). In some embodiments, the threaded holes 126 may correspond to blind tapped holes, or threaded holes that do not pass completely through the second shell 104B of the housing 104. The threaded holes 126 may be arranged in one or more sets. For instance, a first set may be configured to receive fasteners attaching a first heat transfer plate, and an alternative second set that are configured to receive fasteners attaching a second different heat transfer plate. In one embodiment, one or more of the threaded holes 126 may be common for attachment between different heat transfer plates. In any event, when the heat transfer plate is engaged with the external plate receiving space 118 and the sidewalls 124A, 124B of the second shell 104B, holes in the heat transfer plate may axially align with one or more of the threaded holes 126 in the second shell 104B. In this arrangement, assembly of the heat transfer plate to the housing 104 can be performed quickly and easily, for example, without the need to adjust or hold a position of the heat transfer plate relative to the second shell 104B during fastening and attachment.

The second shell 104B may include a heat transfer bar 128 or other internal protrusion arranged in the receiving cavity 110. The heat transfer bar 128 may extend in a direction from the second shell 104B toward the circuit substrate 106 and, more specifically, toward at least one heat-generating circuit package 108 on the circuit substrate 106. In some embodiments, the heat transfer bar 128 may be arranged to provide a thermal conduction path between the heat-generating circuit package 108 inside the receiving cavity 110 and the exterior 122 through the second shell 104B. In one embodiment, a thermal interface material may be disposed between a surface of the heat transfer bar 128 and the heat-generating circuit package 108 of the circuit substrate 106. Additionally or alternatively, the heat transfer bar 128 may provide a strengthening feature between width sides of the second shell 104B. The heat transfer bar 128 may prevent warpage of the second shell 104B out of the XZ-plane and/or deforming of the width sides of the second shell 104B out of the YZ-plane.

As illustrated in the section view of FIG. 1D, once the second shell 104B is attached to the first shell 104A, the housing 104 of the pluggable network interface device subassembly 100 is formed. The attachment of the second shell 104B to the first shell 104A may provide an airtight and/or watertight seal between the receiving cavity 110 and the exterior 122 of the pluggable network interface device subassembly 100. Even prior to attaching a heat transfer plate, the circuit substrate 106 disposed inside the pluggable network interface device subassembly 100 is protected from particulate, detritus, or other contaminates passing from the exterior 122 into the receiving cavity 110. At least one benefit of this sealed pluggable network interface device subassembly 100 is that the pluggable network interface device subassembly 100 can be assembled, tested, and stored indefinitely without designating a heat transfer plate type or module type and without subjecting the circuit substrate 106 and/or any components inside the receiving cavity 110 to contamination. Stated another way, the components inside the housing 104 are completely protected from being contaminated from the environment outside of the housing 104, even when absent an attached module-specific heat transfer plate.

The overall outermost width, W, of the pluggable network interface device subassembly 100 may be measured from an exterior surface of the housing 104 on the first width side 150A to an exterior surface of the housing 104 on the second width side 150B. As shown in FIG. 1D, the overall outermost width, W, defines a total width of the pluggable network interface device subassembly 100 measured along the X-axis direction. When the second shell 104B is attached to the first shell 104A, a first assembly height dimension, H1, is measured from the base surface 132 of the first shell 104A to the upper surface 136 of the second shell 104B. The protrusion height point distance, Hp, defines a distance of the sidewalls 124A, 124B extending from the threaded holes 126 to a protrusion height point. In some embodiments, a height dimension, H1+Hp (e.g., measured from the base surface 132 to the protrusion height point) may be less than the overall height of an assembled pluggable network interface module including the pluggable network interface device subassembly 100 and a select heat transfer plate. In one embodiment, a height dimension, H1+Hp (e.g., measured from the base surface 132 to the protrusion height point) may be the same as the overall height of an assembled pluggable network interface module including the pluggable network interface device subassembly 100 and a select heat transfer plate.

Figure 2:
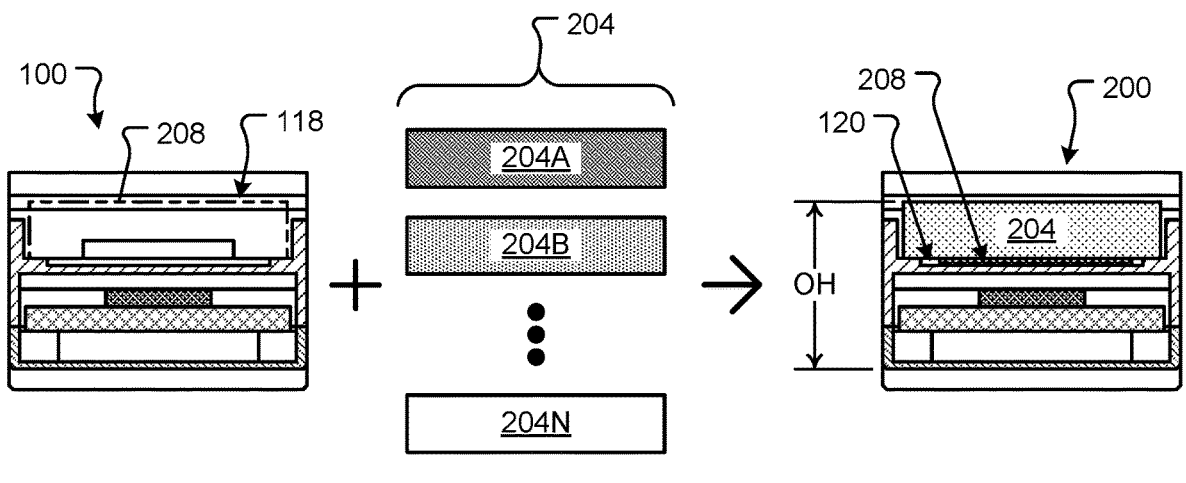
FIG. 2 shows a schematic section view, taken through line "1D-1D" of FIG. 1A, of an assembled pluggable network interface device with swappable heat transfer plates.

Referring now to FIG. 2, a schematic section view, taken through line "1D-1D" of FIG. 1A, is shown of an assembled pluggable network interface device 200 with swappable heat transfer plates 204. In some embodiments, the pluggable network interface device subassembly 100 and the heat transfer plates 204 shown in FIG. 2 may correspond to a pluggable network interface device kit. The kit may include a pluggable network interface device subassembly 100 and at least one heat transfer plate 204. The heat transfer plate 204 may be selected from a set of heat transfer plates 204A-204N including a first heat transfer plate 204A associated with a first module type (e.g., IHS, RHS, etc.), a second heat transfer plate 204B associated with a second module type (e.g., IHS, RHS, etc.), and/or more other heat transfer plates 204N associated with other module types (e.g., IHS, RHS, etc.).

The assembled pluggable network interface module 200 shown in FIG. 2 is formed by providing a pluggable network interface device subassembly 100, selecting a heat transfer plate 204 from the set of heat transfer plates 204A-204N, and attaching the selected heat transfer plate 204 to the pluggable network interface device subassembly 100. In some embodiments, a thermal interface material 208 may be disposed between the second shell 104B and the heat transfer plate 204. The thermal interface material 208 may be disposed, dispensed, placed, or otherwise arranged in the recessed portion 120 of the second shell 104B. In some embodiments, the thermal interface material 208 may be configured to extend higher than the depth dimension, D, of the recessed portion 120 and, when the heat transfer plate 204 is attached to the second shell 104B, the thermal interface material 208 may be forced to displace into the space, or volume, between the heat transfer plate 204 and the second shell 104B. The displacement of the thermal interface material 208 may fill a majority of the empty space in the recessed portion 120 of the second shell 104B.

When the heat transfer plate 204 is attached to the pluggable network interface device subassembly 100 forming the assembled pluggable network interface module 200, the overall height, OH, of the assembled pluggable network interface module 200 may be measured from the base surface 132 of the housing 104 to an uppermost surface of the heat transfer plate 204. Regardless which module type of heat transfer plate 204 is selected from the set of heat transfer plates 204A-204N, the overall height, OH, of the assembled pluggable network interface module 200 conforms to the dimensions outlined in the SPEC for the module type selected (e.g., IHS, RHS, etc.). When the module type selected is an IHS module, the overall height, OH, of the assembled pluggable network interface module 200 may be no greater than 13.1 mm in size. On the other hand, when the module type selected is an RHS module, the overall height, OH, of the assembled pluggable network interface module 200 may be no greater than 9.6 mm in size. In contrast, the first assembly height dimension, H1, may correspond to approximately 7.0 mm in size. As can be appreciated, in any selected module type, the overall height, OH, of the assembled pluggable network interface module 200 is greater than the first assembly height dimension, H1, of a pluggable network interface device subassembly 100.

Figure 3A:
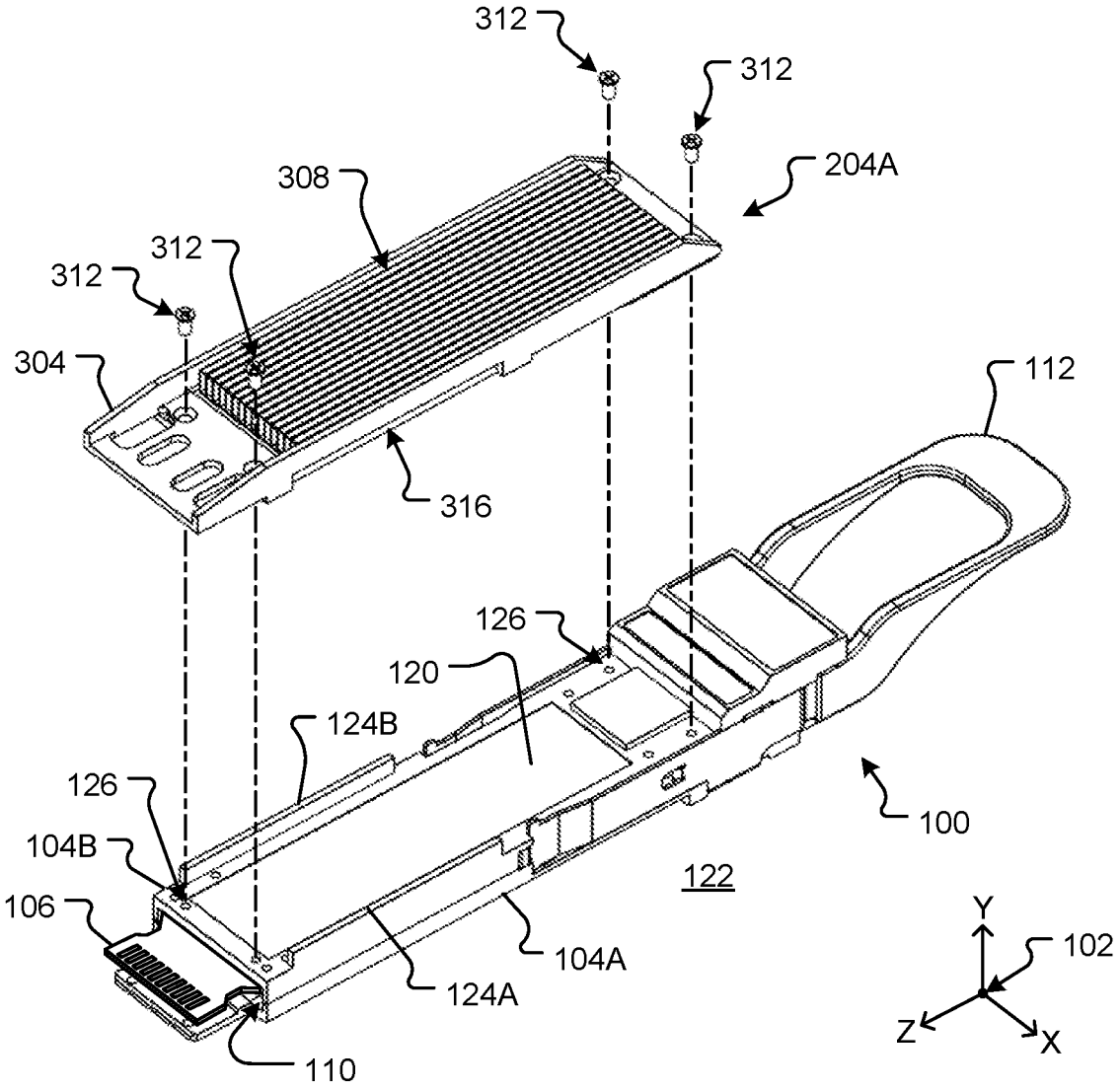
FIG. 3A shows an exploded perspective view of a pluggable network interface device and a first heat transfer plate in accordance with embodiments of the present disclosure.
Figure 3B:
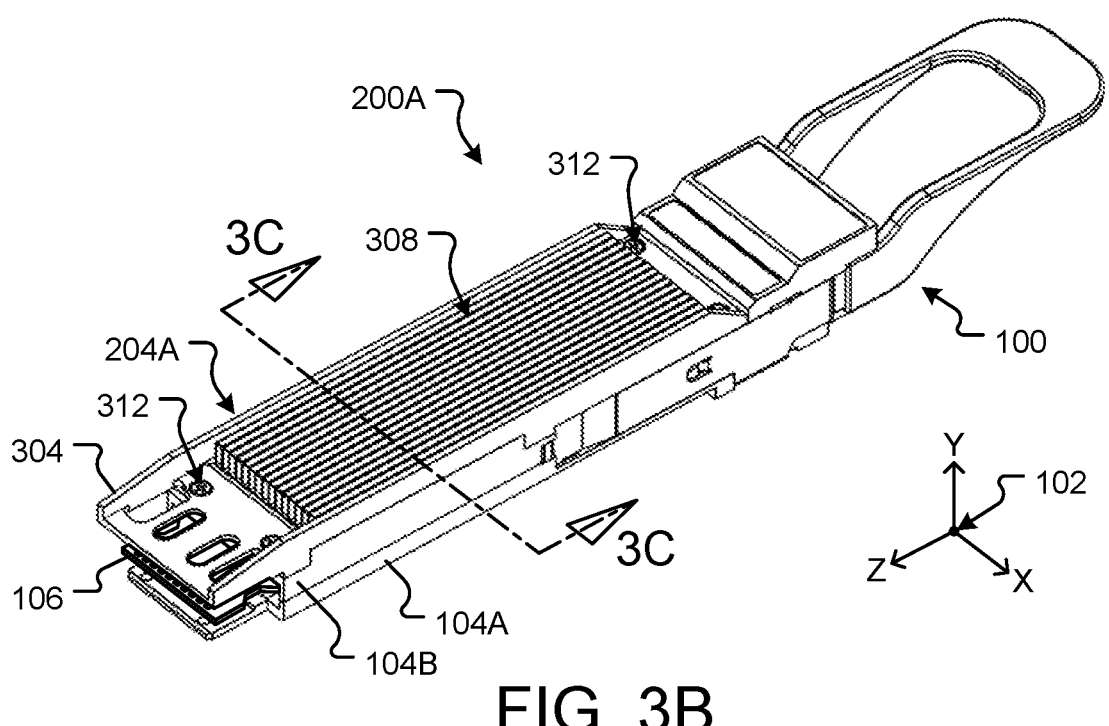
FIG. 3B shows a perspective view of the pluggable network interface device and first heat transfer plate of FIG. 3A in an assembled state.
Figure 3C:
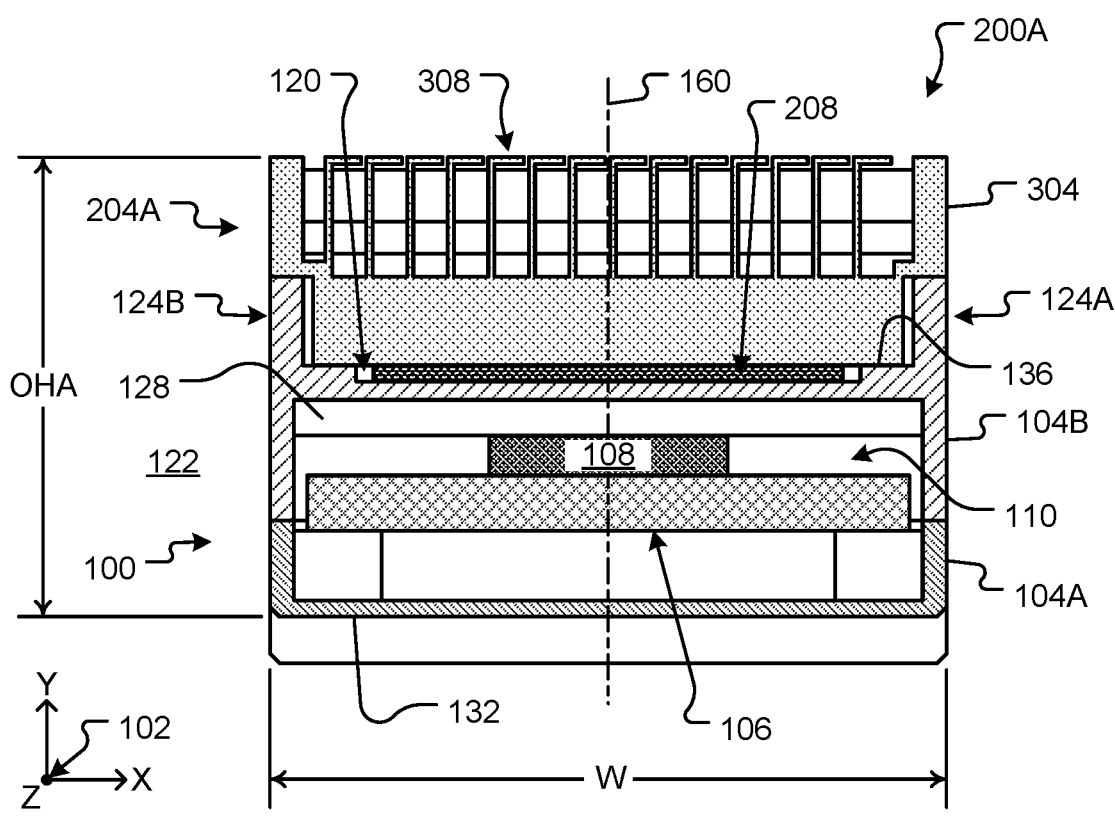
FIG. 3C shows a section view taken through line "3C-3C" of FIG. 3B in accordance with embodiments of the present disclosure.

FIGS. 3A-3C show various views of a first assembled pluggable network interface module 200A including a first heat transfer plate 204A in accordance with embodiments of the present disclosure. The first assembled pluggable network interface module 200A may correspond to the assembled pluggable network interface module 200 described in conjunction with FIG. 2. Although not visible in FIG. 3A, a thermal interface material 208 may be disposed between the first heat transfer plate 204A and the second shell 104B of the pluggable network interface device subassembly 100 as described at least in conjunction with FIG. 2 and as illustrated in FIG. 3C. The first assembled pluggable network interface module 200A includes a pluggable network interface device subassembly 100 and a first heat transfer plate 204A attached thereto. The pluggable network interface device subassembly 100 shown in FIGS. 3A-3C may be the same as, or similar to, the pluggable network interface device subassembly 100 described in conjunction with FIGS. 1A-2 above. The first heat transfer plate 204A may be attached to the second shell 104B of the pluggable network interface device subassembly 100 via one or more fasteners 312 that threadedly engage with one or more threaded holes 126 in the second shell 104B of the pluggable network interface device subassembly 100 housing 104. In some embodiments, the fasteners 312 may correspond to flat head screws, socket head cap screws, machine screws, and/or other threaded fasteners.

The first heat transfer plate 204A may correspond to an IHS module type of heatsink. The first heat transfer plate 204A includes a body 304, a plurality of cooling fins 308, and one or more plate engagement slots 316. The body 304 may be arranged to include the plurality of cooling fins 308 formed therefrom and/or attached thereto. The plurality of cooling fins 308 may extend along a portion of the length, L, of the first assembled pluggable network interface module 200A, for example, in the Z-axis direction. The plurality of cooling fins 308 may protrude from the body 304 of the first heat transfer plate 204A in a direction parallel to the first assembly height dimension, H1, for example, in the Y-axis direction. The body 304 may include a portion that extends over the circuit substrate 106 (e.g., at the second end 130B of the pluggable network interface device subassembly 100) that is configured to protect the circuit substrate 106 from exposure to contact from the X-axis, Y-axis, and/or Z-axis directions.

FIG. 3C shows a section view taken through line "3C-3C" of FIG. 3B in accordance with embodiments of the present disclosure. As illustrated in FIG. 3C, the heat transfer bar 128 of the second shell 104B may be arranged adjacent to, or in contact with, the heat-generating circuit package 108 of the circuit substrate 106. In this arrangement, a heat transfer path may be provided from the heat-generating circuit package 108 through the heat transfer bar 128 and the second shell 104B to the first heat transfer plate 204A. In some embodiments, the heat transfer path may pass through the thermal interface material 208 arranged between the first heat transfer plate 204A and the second shell 104B.

The first outermost height, OHA, of the first assembled pluggable network interface module 200A may correspond to a dimension measured from the base surface 132 of the first shell 104A to the uppermost surface of the first heat transfer plate 204A. In the first assembled pluggable network interface module 200A, the first outermost height, OHA, may correspond to the overall dimension of an IHS module, as outlined in the SPEC. For example, the first outermost height, OHA, may correspond to the height of an IHS OSFP device. In one example, the first outermost height, OHA, of the first assembled pluggable network interface module 200A, representing an IHS OSFP device, may be no greater than 13.1 mm in size.

Figure 4A:
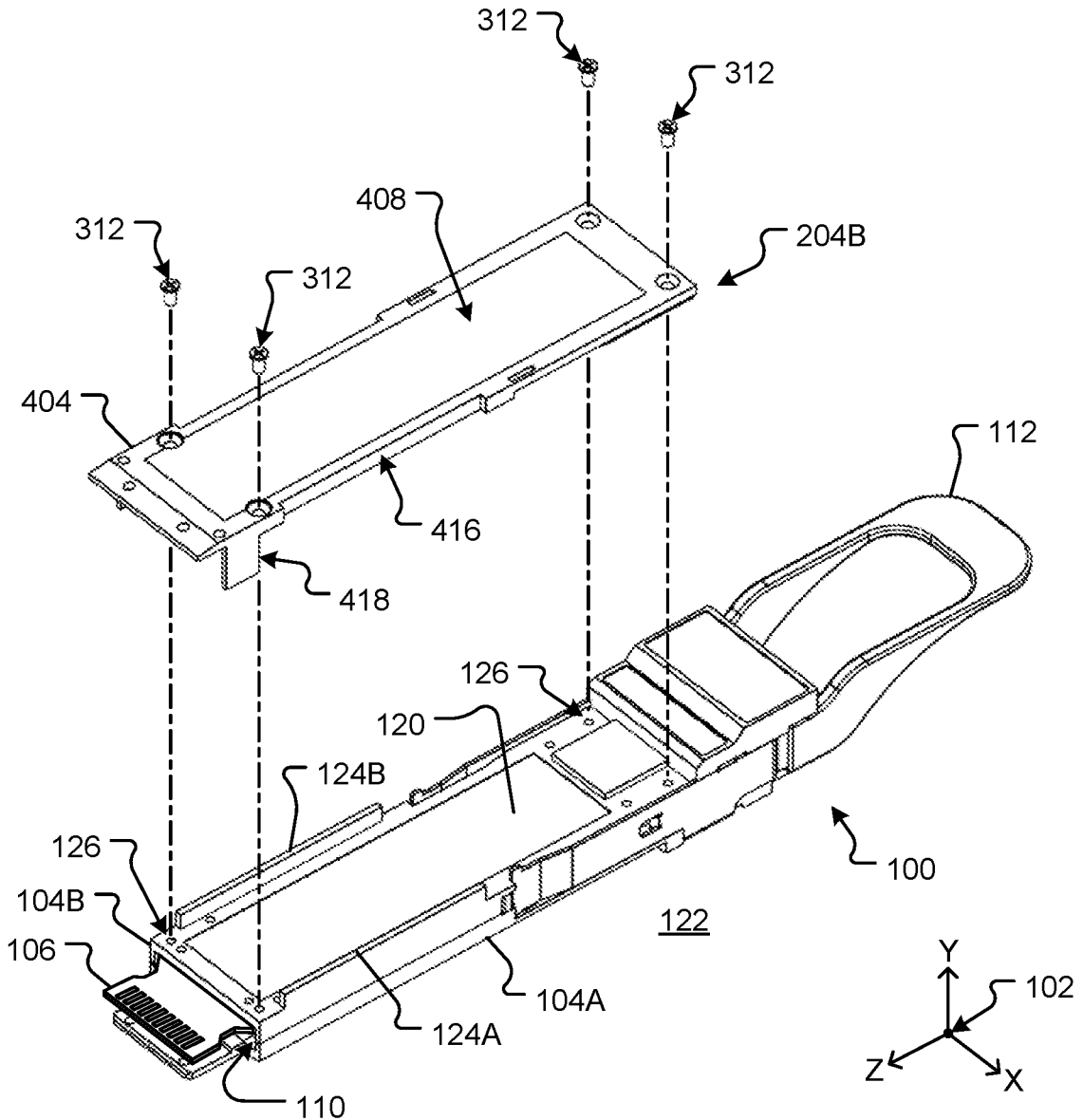
FIG. 4A shows an exploded perspective view of a pluggable network interface device and a second heat transfer plate in accordance with embodiments of the present disclosure.
Figure 4B:
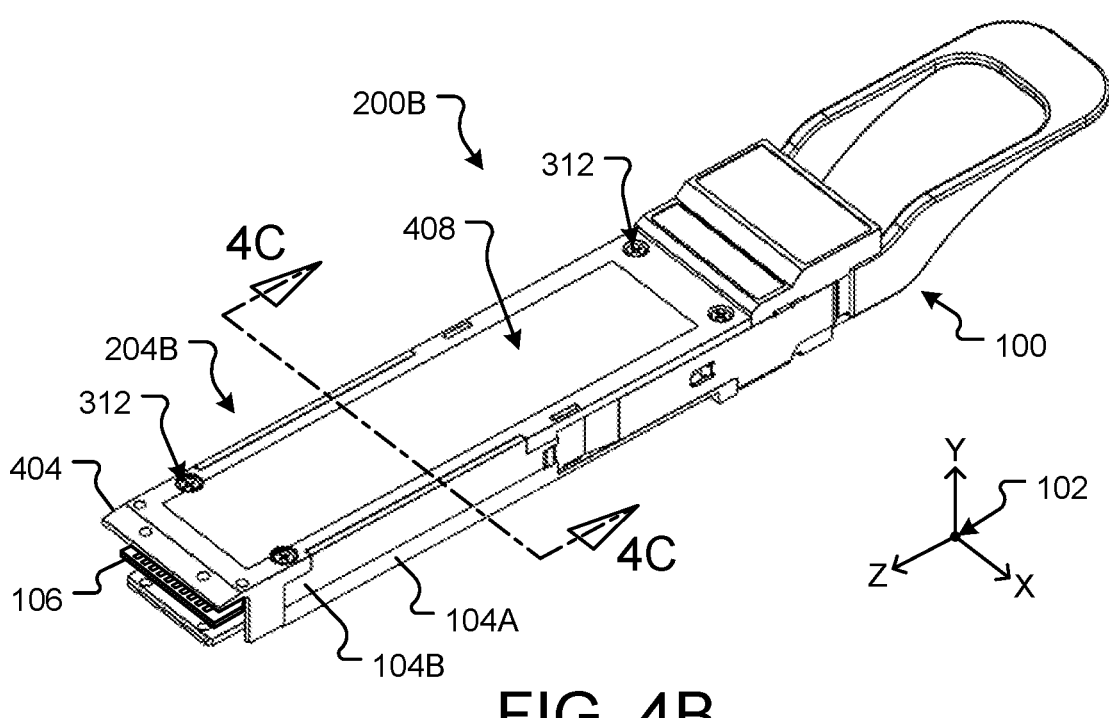
FIG. 4B shows a perspective view of the pluggable network interface device and second heat transfer plate of FIG. 4A in an assembled state.
Figure 4C:
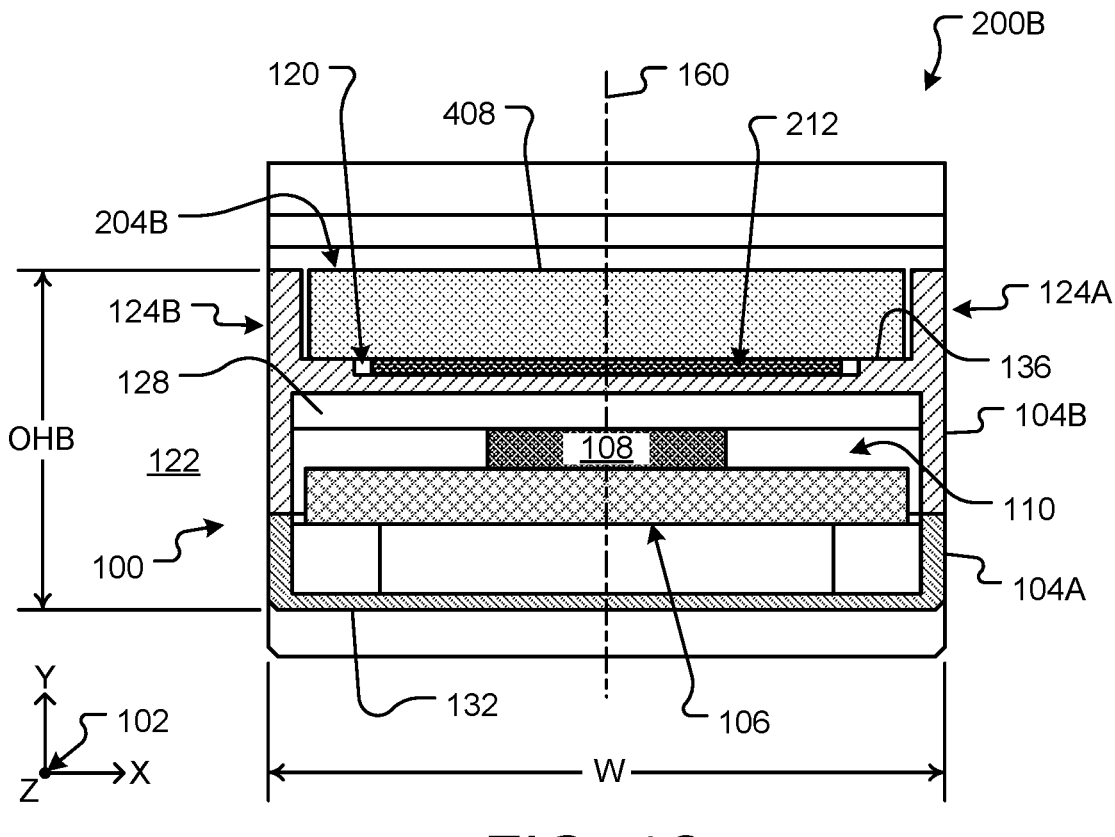
FIG. 4C shows a section view taken through line "4C-4C" of FIG. 4B in accordance with embodiments of the present disclosure.

FIGS. 4A-4C show various views of a second assembled pluggable network interface module 200B including a second heat transfer plate 204B in accordance with embodiments of the present disclosure. The second assembled pluggable network interface module 200B may correspond to the assembled pluggable network interface module 200 described in conjunction with FIG. 2. Although not visible in FIG. 4A, a thermal interface material 208 may be disposed between the second heat transfer plate 204B and the second shell 104B of the pluggable network interface device subassembly 100 as described at least in conjunction with FIG. 2 and as illustrated in FIG. 4C. The second assembled pluggable network interface module 200B includes a pluggable network interface device subassembly 100 and a second heat transfer plate 204B attached thereto. The pluggable network interface device subassembly 100 shown in FIGS. 4A-4C may be the same as, or similar to, the pluggable network interface device subassembly 100 described in conjunction with FIGS. 1A-2 and FIGS. 3A-3C above. The second heat transfer plate 204B may be attached to the second shell 104B of the pluggable network interface device subassembly 100 via one or more fasteners 312 that threadedly engage with one or more threaded holes 126 in the second shell 104B of the pluggable network interface device subassembly 100 housing 104. In some embodiments, the fasteners 312 may be the same as, or similar to, the fasteners 312 described in conjunction with FIGS. 3A-3C. In some cases, the fasteners 312 associated with the second heat transfer plate 204B may interface with a different set of threaded holes 126 in the second shell 104B than those associated with the first heat transfer plate 204A.

The second heat transfer plate 204B may correspond to an RHS module type of heatsink. The second heat transfer plate 204B includes a body 404, an uppermost surface 408, and one or more plate engagement slots 416. The body 404 may be arranged to include the plurality of cooling fins 308 formed therefrom and/or attached thereto. The body 404 may comprise a flat surface running parallel to the upper surface 136 of the pluggable network interface device sub-assembly 100, when assembled. The uppermost surface 408 may provide a conduction cooling contact surface that extends in a plane that is parallel to the XZ-plane. The body 304 may include a side shield 418 that extends from the uppermost surface 408 of the body 404 in a direction toward the pluggable network interface device subassembly 100, when assembled. Stated another way, the side shield 418 may extend in a plane parallel to the YZ-plane at a second end 130B of the second assembled pluggable network interface module 200B. In some embodiments, the second heat transfer plate 204B may include a side shield 418 arranged on both width sides of the body 404 (e.g., symmetrically about centerline 160). The side shield 418 may provide a portion of material that extends along exposed sides of the circuit substrate 106 at the second end 130B of the second assembled pluggable network interface module 200B. This side shield 418 may be configured to protect the circuit substrate 106 from exposure to contact along the width sides of the second assembled pluggable network interface module 200B. In some embodiments, the second heat transfer plate 204B may include a front top cover portion that extends over the circuit substrate 106 (e.g., at the second end 130B of the pluggable network interface device subassembly 100) that is configured to the circuit substrate 106 from exposure to contact from the X-axis, Y-axis, and/or Z-axis directions.

FIG. 4C shows a section view taken through line "4C-4C" of FIG. 4B in accordance with embodiments of the present disclosure. As illustrated in FIG. 4C, the heat transfer bar 128 of the second shell 104B may be arranged adjacent to, or in contact with, the heat-generating circuit package 108 of the circuit substrate 106. In this arrangement, a heat transfer path may be provided from the heat-generating circuit package 108 through the heat transfer bar 128 and the second shell 104B to the second heat transfer plate 204B. In some embodiments, the heat transfer path may pass through the thermal interface material 208 arranged between the second heat transfer plate 204B and the second shell 104B.

The second outermost height, OHB, of the second assembled pluggable network interface module 200B may correspond to a dimension measured from the base surface 132 of the first shell 104A to the uppermost surface 408 of the second heat transfer plate 204B. In the second assembled pluggable network interface module 200B, the second outermost height, OHB, may correspond to the overall dimension of an RHS module, as outlined in the SPEC. For instance, the second outermost height, OHB, may correspond to the height of an RHS OSFP device. In one example, the second outermost height, OHB, of the second assembled pluggable network interface module 200B, representing an RHS OSFP device, may be no greater than 9.6 mm in size.

Referring to FIG. 5, a flow diagram of a method for customizing a network interface module is shown in accordance with embodiments of the present disclosure. The method may include building and/or customizing a pluggable network interface device 200 using a pluggable network interface device subassembly 100 and attaching a heat transfer plate 204 selected from a set of heat transfer plates 204A-204N.

The method may begin by providing a first shell 104A of a pluggable network interface device subassembly 100 (step 504). The first shell 104A may correspond to a first half of a housing 104 of the pluggable network interface device subassembly 100 as shown and described in conjunction with FIGS. 1A-1C. A second shell 104B of the pluggable network interface device subassembly 100 may be provided including one or more features that interface and attach with the first shell 104A (step 508). The second shell 104B may correspond to a second half of the housing 104 of the pluggable network interface device subassembly 100 as shown and described in conjunction with FIGS. 1A-1C. Next, a circuit substrate 106, or PCB, may be attached to, or arranged within, the receiving cavity 110 of the pluggable network interface device subassembly 100 (step 512). For instance, the circuit substrate 106 may be attached to at least one of the first shell 104A and/or the second shell 104B. In some embodiments, the circuit substrate 106 may be attached by fastening the circuit substrate 106 to one or more features inside the receiving cavity 110 of the housing 104.

Once, the circuit substrate 106 is arranged inside the receiving cavity 110, the second shell 104B may be attached to the first shell 104A completing the pluggable network interface device subassembly 100 (step 516). In this assembled state, the circuit substrate 106 is enclosed in the housing 104 and the receiving cavity 110 is sealed and/or separated from the exterior 122. In one embodiment, the attachment of the first shell 104A to the second shell 104B may provide an airtight or watertight seal for the housing 104 between the receiving cavity 110 and the exterior 122 of the pluggable network interface device subassembly 100.

Next, the method may proceed by selecting a heat transfer plate 204 from a set, or plurality, of heat transfer plates 204A-204N (step 520). The set of heat transfer plates 204A-204N may include an IHS module type of heatsink, an RHS module type of heatsink, and/or some other module type of heatsink. In some embodiments, an end user may select the heat transfer plate 204 from the set of heat transfer plates 204A-204N provided as part of a pluggable network interface module kit.

The method includes attaching the selected heat transfer plate 204 to the second shell 104B of the pluggable network interface device subassembly 100 (step 524). Each heat transfer plate 204 in the set of heat transfer plates 204A-204N may attach to the pluggable network interface device subassembly 100 via a set of modular plate receiving features such as the threaded holes 126, sidewalls 124A, 124B, and upper surface 136 of the second shell 104B. The selected heat transfer plate 204 may then be attached to the second shell 104B via one or more fasteners 312 engaging with a portion of the heat transfer plate 204 and then engaging with corresponding threaded holes 126. In some embodiments, a thermal interface material 208 may be disposed between the heat transfer plate 204 and the second shell 104B prior to attaching the heat transfer plate 204 to the second shell 104B. When the heat transfer plate 204 is attached to the pluggable network interface device subassembly 100, the assembled pluggable network interface module 200 may be referred to as being in a finished assembly state.

In some embodiments, the method may include swapping an existing, or installed, heat transfer plate 204 with a different heat transfer plate 204 selected from the set of heat transfer plates 204A-204N. In this example, the method may proceed by removing the heat transfer plate 204 from the upper surface 136, or the external plate receiving space 118, of the pluggable network interface device subassembly 100 (step 528). In some embodiments, the heat transfer plate 204 may be removed by first removing the fasteners 312 from the threaded holes 126, that are fastening the heat transfer plate 204 to the pluggable network interface device subassembly 100, and then completely separating the heat transfer plate 204 from the second shell 104B.

Next, the method continues by selecting an alternative heat transfer plate 204 from the set of heat transfer plates 204A-204N (step 532). The alternative heat transfer plate 204 may correspond to a heat transfer plate 204 of a different module type than the one removed in step 528. However, in some cases, the alternative heat transfer plate 204 may correspond to the same module type as the heat transfer plate 204 removed. In some embodiments, swapping the heat transfer plate 204 for an alternative heat transfer plate 204 may allow the assembled pluggable network interface module 200 to be changed to be utilized as a different module type, such as an IHS module type, an RHS module type, and/or some other module type of OSFP. Once the alternative heat transfer plate 204 is selected, the method may continue by attaching the selected alternative heat transfer plate 204 to the second shell 104B of the pluggable network interface device subassembly 100 (step 536). The alternative heat transfer plate 204 may attach to the pluggable network interface device subassembly 100 via the same set, or a different set, of the modular plate receiving features in the second shell 104B used for attaching the heat transfer plate 204 (e.g., the threaded holes 126, sidewalls 124A, 124B, and upper surface 136 of the second shell 104B, etc.). The alternative heat transfer plate 204 may be attached to the second shell 104B via one or more fasteners 312 engaging with a portion of the heat transfer plate 204 and then engaging with corresponding threaded holes 126 in the second shell 104B. In some embodiments, a thermal interface material 208 may be disposed between the alternative heat transfer plate 204 and the second shell 104B prior to attaching the alternative heat transfer plate 204 to the second shell 104B. One or more steps of this process may be repeated to swap the heat transfer plate 204, or alternative heat transfer plate 204, for another heat transfer plate 204 in the set of heat transfer plates 204A-204N as desired.

While the flowchart of FIG. 5 has been discussed and illustrated in relation to a particular sequence of events, it should be appreciated that changes, additions, and omissions to this sequence can occur without materially affecting the operation of the disclosed embodiments, configurations, and aspects.

The exemplary systems and methods of this disclosure have been described in relation to the pluggable network interface devices, modules, and systems. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others.

References in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in conjunction with one embodiment, it is submitted that the description of such feature, structure, or characteristic may apply to any other embodiment unless so stated and/or except as will be readily apparent to one skilled in the art from the description. The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Exemplary aspects are directed to a pluggable network interface module, comprising: a PCB comprising at least one circuit; and a housing comprising: a first shell extending a length from a first end of the pluggable network interface module to a second end of the pluggable network interface module, the first shell comprising a first cavity running along a portion of the length and a base surface defining an exterior of the first shell; and a second shell extending the length and comprising a second cavity running along a portion of the length and an upper surface defining an exterior of the second shell, wherein the first shell is joined to the second shell, wherein the first cavity and the second cavity together form a receiving cavity for the housing, and wherein the upper surface is offset from the base surface by a first assembly height dimension; wherein a portion of the PCB is disposed inside the receiving cavity between the base surface and the upper surface, wherein the upper surface comprises a set of modular plate receiving features, and wherein, in an assembled state, the upper surface of the pluggable network interface module is attached via the set of modular plate receiving features to one heat transfer plate of a set of heat transfer plates, and wherein an overall height of the pluggable network interface module in the assembled state is greater than the first assembly height dimension.

Any one or more of the above aspects include wherein the one heat transfer plate of the set of heat transfer plates corresponds to an integrated heatsink comprising a plurality of cooling fins protruding in a direction parallel to the first assembly height dimension. Any one or more of the above aspects include wherein the overall height of the pluggable network interface module in the assembled state corresponds to a height of an OSFP device. Any one or more of the above aspects include wherein the upper surface comprises a recessed portion extending in a direction toward the PCB. Any one or more of the above aspects include wherein the one heat transfer plate of the set of heat transfer plates corresponds to a riding heatsink comprising a flat surface running parallel to the upper surface. Any one or more of the above aspects include wherein the set of modular plate receiving features comprises a plurality of blind threaded holes extending into the upper surface of the second shell in a direction toward the second cavity. Any one or more of the above aspects include wherein, in the assembled state, the one heat transfer plate is attached to the upper surface via a plurality of fasteners threadedly engaged with the plurality of blind threaded holes. Any one or more of the above aspects include wherein the set of modular plate receiving features comprises at least one protrusion extending a distance from the upper surface in a direction away from the second cavity to a protrusion height point, and wherein a height dimension measured from the base surface to the protrusion height point is less than the overall height of the pluggable network interface module in the assembled state. Any one or more of the above aspects include wherein a thermal interface material is disposed between the second shell and the one heat transfer plate in the assembled state. Any one or more of the above aspects include wherein the one heat transfer plate is an integrated heatsink comprising a plurality of cooling fins protruding in a direction parallel to the first assembly height dimension or is a riding heatsink comprising a flat surface running parallel to the upper surface. Any one or more of the above aspects include wherein the overall height of the pluggable network interface module in the assembled state is approximately 13 mm (e.g., in an IHS module configuration). Any one or more of the above aspects include wherein the first assembly height dimension is approximately 7.0 mm. Any one or more of the above aspects include wherein the overall height of the pluggable network interface module in the assembled state is approximately 9.5 mm (e.g., in an RHS module configuration).

Exemplary aspects are directed to a pluggable network interface device kit, comprising: a housing comprising: a first shell extending a length from a first end of a pluggable network interface device to a second end of the pluggable network interface device, the first shell comprising a first cavity running along a portion of the length and a base surface defining an exterior of the first shell; and a second shell extending the length and comprising a second cavity running along a portion of the length and an upper surface defining an exterior of the second shell, wherein the upper surface comprises a set of modular plate receiving features, wherein the first shell is joined to the second shell, wherein the first cavity and the second cavity together form a receiving cavity for the housing, and wherein the upper surface is offset from the base surface by a first assembly height dimension; a PCB comprising at least one circuit, wherein a portion of the PCB is disposed inside the receiving cavity between the base surface and the upper surface; and a first heat transfer plate attached to the upper surface of the second shell via the set of modular plate receiving features, wherein the first heat transfer plate comprises a first thickness extending a first distance from the upper surface of the second shell to an uppermost surface of the first heat transfer plate, wherein the first heat transfer plate comprises an outermost plate width corresponding to an overall outermost width of the housing, and wherein an outermost height measured from the base surface of the first shell to the uppermost surface of the first heat transfer plate is greater than the first assembly height dimension.

Any one or more of the above aspects further comprising: a second heat transfer plate comprising a set of modular engagement features, wherein the set of modular engagement features are configured to mate with the set of modular plate receiving features, wherein the second heat transfer plate comprises a second thickness that is different from the first thickness. Any one or more of the above aspects include wherein the first heat transfer plate comprises the set of modular engagement features, and wherein, in a first assembled state, the first heat transfer plate is attached to the upper surface of the second shell, and wherein, in a second assembled state, the first heat transfer plate is detached from the upper surface of the second shell and the second heat transfer plate is attached to the upper surface of the second shell via the set of modular plate receiving features. Any one or more of the above aspects include wherein the first heat transfer plate corresponds to an integrated heatsink comprising a plurality of cooling fins protruding in a direction parallel to the first assembly height dimension. Any one or more of the above aspects include wherein the second heat transfer plate corresponds to a riding heatsink comprising a flat surface running parallel to the upper surface, and wherein, in the second assembled state, an alternate outermost height measured from the base surface of the first shell to an uppermost surface of the second heat transfer plate is greater than the first assembly height dimension. Any one or more of the above aspects include wherein the outermost height corresponds to a height of an assembled OSFP device. Any one or more of the above aspects include wherein the set of modular plate receiving features comprises a plurality of blind threaded holes extending into the upper surface of the second shell in a direction toward the second cavity, and wherein the first heat transfer plate is attached to the upper surface via a plurality of fasteners threadedly engaged with the plurality of blind threaded holes. Any one or more of the above aspects include wherein a thermal interface material is disposed between the second shell and the first heat transfer plate. Any one or more of the above aspects include wherein the heat transfer plate is an integrated heatsink comprising a plurality of cooling fins protruding in a direction parallel to the first assembly height dimension and the overall height of the pluggable network interface module in the assembled state is no greater than 13.1 mm or is a riding heatsink comprising a flat surface running parallel to the upper surface and the overall height of the pluggable network interface module in the finished assembly state is no greater than 9.6 mm.

Exemplary aspects are directed to a method of customizing a network interface module, comprising: providing a first shell of a housing for a pluggable network interface device, the first shell extending a length from a first end of the pluggable network interface device to a second end of the pluggable network interface device, the first shell comprising a first cavity running along a portion of the length, and the first shell comprising a base surface defining an exterior of the first shell; providing a second shell extending the length and comprising a second cavity running along a portion of the length and an upper surface defining an exterior of the second shell, wherein the upper surface comprises a set of modular plate receiving features; attaching a PCB to the first cavity; attaching the second shell to the first shell enclosing a portion of the PCB in a receiving cavity formed by the first cavity and the second cavity, such that the upper surface is offset from the base surface by a first assembly height dimension; selecting a heat transfer plate from a plurality of heat transfer plates associated with a plurality of module types; and attaching the heat transfer plate selected to the upper surface via the set of modular plate receiving features such that an first overall height of the pluggable network interface device comprising the heat transfer plate attached thereto is greater than the first assembly height dimension.

Any one or more of the above aspects further comprising: removing the heat transfer plate selected from the upper surface; selecting an alternative heat transfer plate from the plurality of heat transfer plates associated with a plurality of module types, the plurality of module types comprising an integrated heatsink type of module and a riding heatsink type of module, the integrated heatsink type of module being associated with an integrated heat transfer plate comprising a plurality of cooling fins protruding in a direction parallel to the first assembly height dimension, the riding heatsink type of module being associated with a riding heat transfer plate comprising a flat surface running parallel to the upper surface, wherein the alternative heat transfer plate is different type of plate than the heat transfer plate; and attaching the alternative heat transfer plate selected to the upper surface via the set of modular plate receiving features such that a second overall height of the pluggable network interface device comprising the alternative heat transfer plate attached thereto is greater than the first assembly height dimension and different from the first overall height.

Any one or more of the above aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

Any one or more of the features disclosed herein.

Any one or more of the features as substantially disclosed herein.

Any one or more of the features as substantially disclosed herein in combination with any one or more other features as substantially disclosed herein.

Any one of the aspects/features/embodiments in combination with any one or more other aspects/features/embodiments.

Use of any one or more of the aspects or features as disclosed herein.

It is to be appreciated that any feature described herein can be claimed in combination with any other feature(s) as described herein, regardless of whether the features come from the same described embodiment.

As used herein, the singular forms "a," "an," and "the" are intended to include the plural forms as well, unless the context clearly indicates otherwise. It will be further understood that the terms "include," "including," "includes," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B, and C together. When each one of A, B, and C in the above expressions refers to an element, such as X, Y, and Z, or a class of elements, such as X1-Xn, Y1-Ym, and Z1-Zo, the phrase is intended to refer to a single element selected from X, Y, and Z, a combination of elements selected from the same class (e.g., X1 and X2) as well as a combination of elements selected from two or more classes (e.g., Y1 and Zo).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

It should be understood that every maximum numerical limitation given throughout this disclosure is deemed to include each and every lower numerical limitation as an alternative, as if such lower numerical limitations were expressly written herein. Every minimum numerical limitation given throughout this disclosure is deemed to include each and every higher numerical limitation as an alternative, as if such higher numerical limitations were expressly written herein. Every numerical range given throughout this disclosure is deemed to include each and every narrower numerical range that falls within such broader numerical range, as if such narrower numerical ranges were all expressly written herein.

What is claimed is:

1. A pluggable network interface module, comprising:
   a printed circuit board (PCB) comprising at least one circuit; and
   a housing comprising:
      a first shell extending a length from a first end of the pluggable network interface module to a second end of the pluggable network interface module, the first shell comprising a first cavity running along a portion of the length and a base surface defining an exterior of the first shell; and
      a second shell extending the length and comprising a second cavity running along a portion of the length and an upper surface defining an exterior of the second shell, wherein the first shell is joined to the second shell, wherein the first cavity and the second cavity together form a receiving cavity for the housing, and wherein the upper surface is offset from the base surface by a first assembly height dimension;

wherein a portion of the PCB is disposed inside the receiving cavity between the base surface and the upper surface, wherein the upper surface comprises a set of modular plate receiving features arranged along the portion of the length, and wherein, in an assembled state, the upper surface of the pluggable network interface module is attached via the set of modular plate receiving features to one heat transfer plate of a set of heat transfer plates, wherein the one heat transfer plate extends at least along the portion of the length, and wherein an overall height of the pluggable network interface module in the assembled state is greater than the first assembly height dimension.

2. The pluggable network interface module of claim 1, wherein the one heat transfer plate of the set of heat transfer plates corresponds to an integrated heatsink comprising a plurality of cooling fins protruding in a direction parallel to the first assembly height dimension.

3. The pluggable network interface module of claim 1, wherein the overall height of the pluggable network interface module in the assembled state corresponds to a height of an octal small form-factor pluggable (OSFP) device.

4. The pluggable network interface module of claim 1, wherein the upper surface comprises a recessed portion extending in a direction toward the PCB.

5. The pluggable network interface module of claim 1, wherein the one heat transfer plate of the set of heat transfer plates corresponds to a riding heatsink comprising a flat surface running parallel to the upper surface.

6. The pluggable network interface module of claim 1, wherein the set of modular plate receiving features comprises a plurality of blind threaded holes extending into the upper surface of the second shell in a direction toward the second cavity.

7. The pluggable network interface module of claim 6, wherein, in the assembled state, the one heat transfer plate is attached to the upper surface via a plurality of fasteners threadedly engaged with the plurality of blind threaded holes.

8. The pluggable network interface module of claim 1, wherein a thermal interface material is disposed between the second shell and the one heat transfer plate in the assembled state.

9. The pluggable network interface module of claim 1, wherein the one heat transfer plate is an integrated heatsink comprising a plurality of cooling fins protruding in a direction parallel to the first assembly height dimension or is a riding heatsink comprising a flat surface running parallel to the upper surface.

10. A pluggable network interface module, comprising:
a printed circuit board (PCB) comprising at least one circuit; and
a housing comprising:
a first shell extending a length from a first end of the pluggable network interface module to a second end of the pluggable network interface module, the first shell comprising a first cavity running along a portion of the length and a base surface defining an exterior of the first shell; and
a second shell extending the length and comprising a second cavity running along a portion of the length and an upper surface defining an exterior of the second shell, wherein the first shell is joined to the second shell, wherein the first cavity and the second cavity together form a receiving cavity for the housing, and wherein the upper surface is offset from the base surface by a first assembly height dimension;

wherein a portion of the PCB is disposed inside the receiving cavity between the base surface and the upper surface, wherein the upper surface comprises a set of modular plate receiving features, and wherein, in an assembled state, the upper surface of the pluggable network interface module is attached via the set of modular plate receiving features to one heat transfer plate of a set of heat transfer plates, wherein an overall height of the pluggable network interface module in the assembled state is greater than the first assembly height dimension, wherein the set of modular plate receiving features comprises at least one protrusion extending a distance from the upper surface in a direction away from the second cavity to a protrusion height point, and wherein a height dimension measured from the base surface to the protrusion height point is less than the overall height of the pluggable network interface module in the assembled state.

11. A pluggable network interface device kit, comprising:
a housing comprising:
a first shell extending a length from a first end of a pluggable network interface device to a second end of the pluggable network interface device, the first shell comprising a first cavity running along a portion of the length and a base surface defining an exterior of the first shell; and
a second shell extending the length and comprising a second cavity running along a portion of the length and an upper surface defining an exterior of the second shell, wherein the upper surface comprises a set of modular plate receiving features, wherein the first shell is joined to the second shell, wherein the first cavity and the second cavity together form a receiving cavity for the housing, and wherein the upper surface is offset from the base surface by a first assembly height dimension;
a printed circuit board (PCB) comprising at least one circuit, wherein a portion of the PCB is disposed inside the receiving cavity between the base surface and the upper surface;
a first heat transfer plate attached to the upper surface of the second shell via the set of modular plate receiving features, wherein the first heat transfer plate comprises a first thickness extending a first distance from the upper surface of the second shell to an uppermost surface of the first heat transfer plate, wherein the first heat transfer plate comprises an outermost plate width corresponding to an overall outermost width of the housing, and wherein an outermost height measured from the base surface of the first shell to the uppermost surface of the first heat transfer plate is greater than the first assembly height dimension, and
a second heat transfer plate comprising a set of modular engagement features, wherein the set of modular engagement features are configured to mate with the set of modular plate receiving features, wherein the second heat transfer plate comprises a second thickness that is different from the first thickness.

12. The pluggable network interface device kit of claim 11, wherein the first heat transfer plate comprises the set of modular engagement features, and wherein, in a first assembled state, the first heat transfer plate is attached to the upper surface of the second shell, and wherein, in a second assembled state, the first heat transfer plate is detached from the upper surface of the second shell and the second heat transfer plate is attached to the upper surface of the second shell via the set of modular plate receiving features.

13. The pluggable network interface device kit of claim 12, wherein the first heat transfer plate corresponds to an integrated heatsink comprising a plurality of cooling fins protruding in a direction parallel to the first assembly height dimension.

14. The pluggable network interface device kit of claim 13, wherein the second heat transfer plate corresponds to a riding heatsink comprising a flat surface running parallel to the upper surface, and wherein, in the second assembled state, an alternate outermost height measured from the base surface of the first shell to an uppermost surface of the second heat transfer plate is greater than the first assembly height dimension.

15. The pluggable network interface device kit of claim 12, wherein the outermost height corresponds to a height of an assembled octal small form-factor pluggable (OSFP) device.

16. The pluggable network interface device kit of claim 12, wherein the set of modular plate receiving features comprises a plurality of blind threaded holes extending into the upper surface of the second shell in a direction toward the second cavity, and wherein the first heat transfer plate is attached to the upper surface via a plurality of fasteners threadedly engaged with the plurality of blind threaded holes.

17. The pluggable network interface device kit of claim 16, wherein a thermal interface material is disposed between the second shell and the first heat transfer plate.

18. A method of customizing a network interface module, comprising:

provide a first shell of a housing for a pluggable network interface device, the first shell extending a length from a first end of the pluggable network interface device to a second end of the pluggable network interface device, the first shell comprising a first cavity running along a portion of the length, and the first shell comprising a base surface defining an exterior of the first shell;

providing a second shell extending the length and comprising a second cavity running along a portion of the length and an upper surface defining an exterior of the second shell, wherein the upper surface comprises a set of modular plate receiving features arranged along the portion of the length;

attaching a printed circuit board (PCB) to the first cavity;

attaching the second shell to the first shell enclosing a portion of the PCB in a receiving cavity formed by the first cavity and the second cavity, such that the upper surface is offset from the base surface by a first assembly height dimension;

selecting a heat transfer plate from a plurality of heat transfer plates associated with a plurality of module types; and attaching the heat transfer plate selected to the upper surface via the set of modular plate receiving features such that the heat transfer plate extends at least along the portion of the length, and such that a first overall height of the pluggable network interface device comprising the heat transfer plate attached thereto is greater than the first assembly height dimension.

19. The method of claim 18, further comprising:

removing the heat transfer plate selected from the upper surface;

selecting an alternative heat transfer plate from the plurality of heat transfer plates associated with a plurality of module types, the plurality of module types comprising an integrated heatsink type of module and a riding heatsink type of module, the integrated heatsink type of module being associated with an integrated heat transfer plate comprising a plurality of cooling fins protruding in a direction parallel to the first assembly height dimension, the riding heatsink type of module being associated with a riding heat transfer plate comprising a flat surface running parallel to the upper surface, wherein the alternative heat transfer plate is different type of plate than the heat transfer plate; and attaching the alternative heat transfer plate selected to the upper surface via the set of modular plate receiving features such that the alternative heat transfer plate selected extends at least along the portion of the length, and such that a second overall height of the pluggable network interface device comprising the alternative heat transfer plate attached thereto is greater than the first assembly height dimension and different from the first overall height.

20. The method of claim 19, wherein the first overall height of the pluggable network interface device is measured at a point along the portion of the length, and wherein the second overall height of the pluggable network interface device is measured at the point along the portion of the length.

* * * * *